US011064606B2

(12) United States Patent
Sato

(10) Patent No.: US 11,064,606 B2
(45) Date of Patent: Jul. 13, 2021

(54) MULTILAYER SUBSTRATE AND ELECTRIC ELEMENT

(71) Applicant: Murata Manufacturing Co., Ltd., Nagaokakyo (JP)

(72) Inventor: Takako Sato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/903,499

(22) Filed: Jun. 17, 2020

(65) Prior Publication Data

US 2020/0315010 A1 Oct. 1, 2020

Related U.S. Application Data

(63) Continuation of application No. PCT/JP2018/046079, filed on Dec. 14, 2018.

(30) Foreign Application Priority Data

Feb. 15, 2018 (JP) .............................. JP2018-025186

(51) Int. Cl.
*H05K 1/11* (2006.01)
*H05K 1/02* (2006.01)
*H05K 1/18* (2006.01)
*H01R 12/75* (2011.01)

(52) U.S. Cl.
CPC ........... *H05K 1/113* (2013.01); *H05K 1/0225* (2013.01); *H05K 1/118* (2013.01); *H05K 1/189* (2013.01); *H01R 12/75* (2013.01); *H05K 2201/09381* (2013.01); *H05K 2201/10189* (2013.01)

(58) Field of Classification Search
CPC ..................... H05K 1/111–114; H05K 1/0242
See application file for complete search history.

(56) References Cited

U.S. PATENT DOCUMENTS

2009/0107703 A1* 4/2009 Abe ..................... H05K 1/0271
174/254
2011/0284278 A1 11/2011 Hine et al.
2017/0150605 A1* 5/2017 Nagai ..................... H05K 3/34

FOREIGN PATENT DOCUMENTS

JP 57-88968 U 6/1982
JP 62-126866 U 8/1987
JP 2000-165042 A 6/2000

(Continued)

OTHER PUBLICATIONS

Official Communication issued in International Patent Application No. PCT/JP2018/046079, dated Mar. 12, 2019.

*Primary Examiner* — Jeremy C Norris
(74) *Attorney, Agent, or Firm* — Keating & Bennett, LLP

(57) ABSTRACT

A multilayer substrate includes a stacked body including a plurality of insulating base material layers stacked on each other and a plurality of conductor patterns provided in contact with the plurality of insulating base material layers. The stacked body includes a first surface, and the plurality of conductor patterns include a plurality of mounting electrodes. The plurality of mounting electrodes include first openings. The first openings, in a plan view of a mounting surface, are provided over a mounting region and a non-mounting region of the mounting electrodes. The mounting region, when a mounted component is mounted, overlaps with the mounted component, and the non-mounting region does not overlap with the mounted component.

16 Claims, 10 Drawing Sheets

(56) References Cited

FOREIGN PATENT DOCUMENTS

| | | | |
|---|---|---|---|
| JP | 2001-144448 | A | 5/2001 |
| JP | 2005-136347 | A | 5/2005 |
| JP | 2006-179809 | A | 7/2006 |
| JP | 2011-243853 | A | 12/2011 |

* cited by examiner

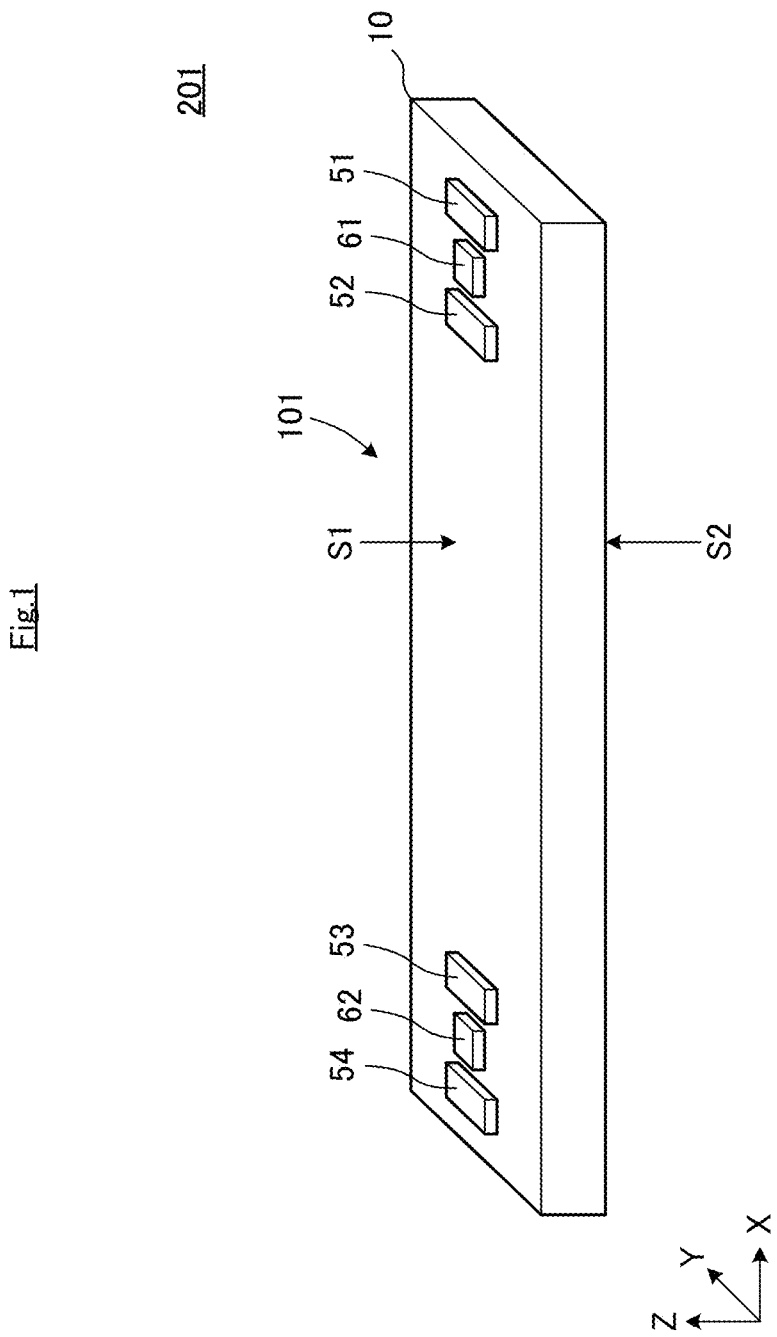

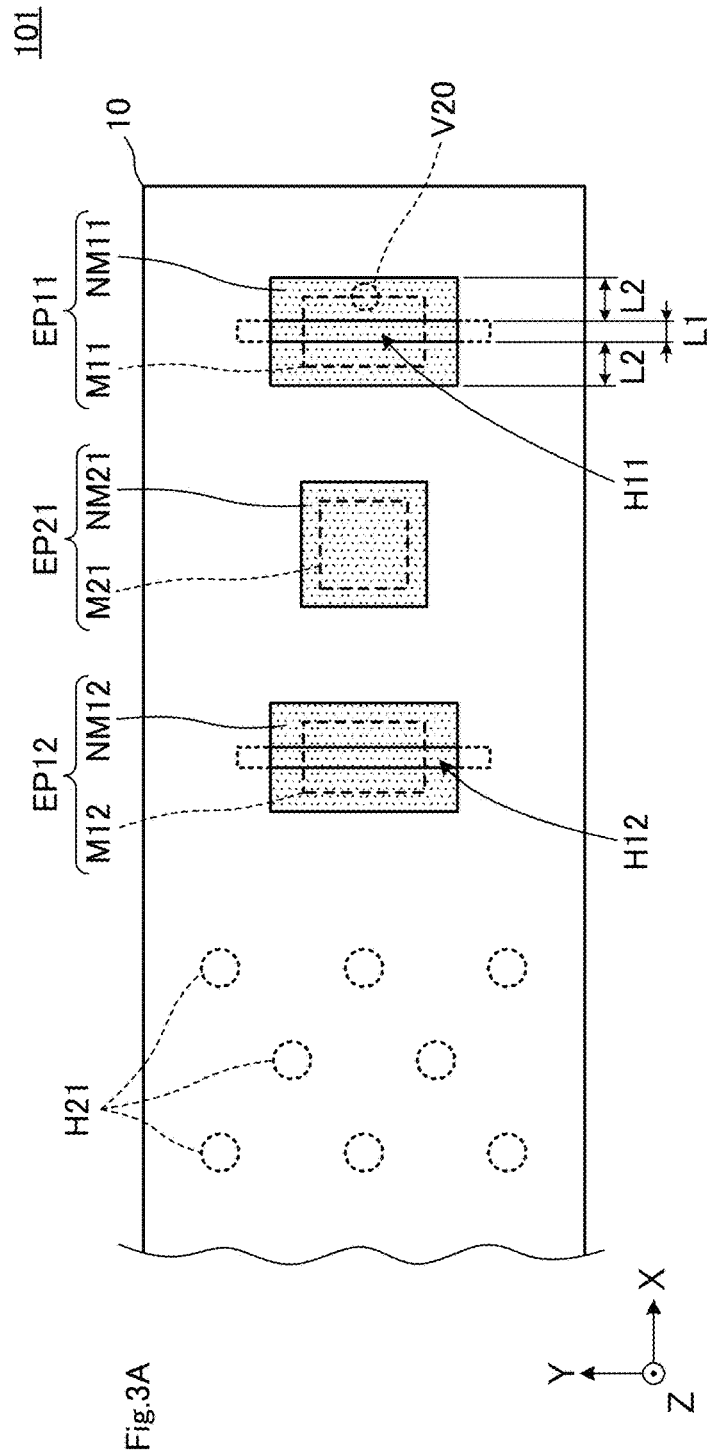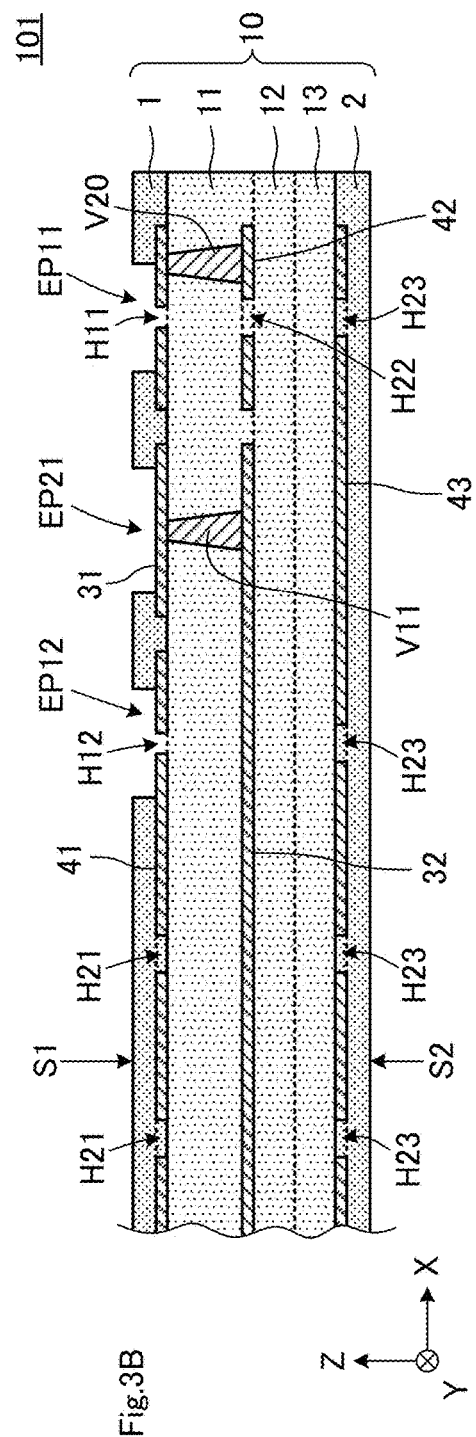

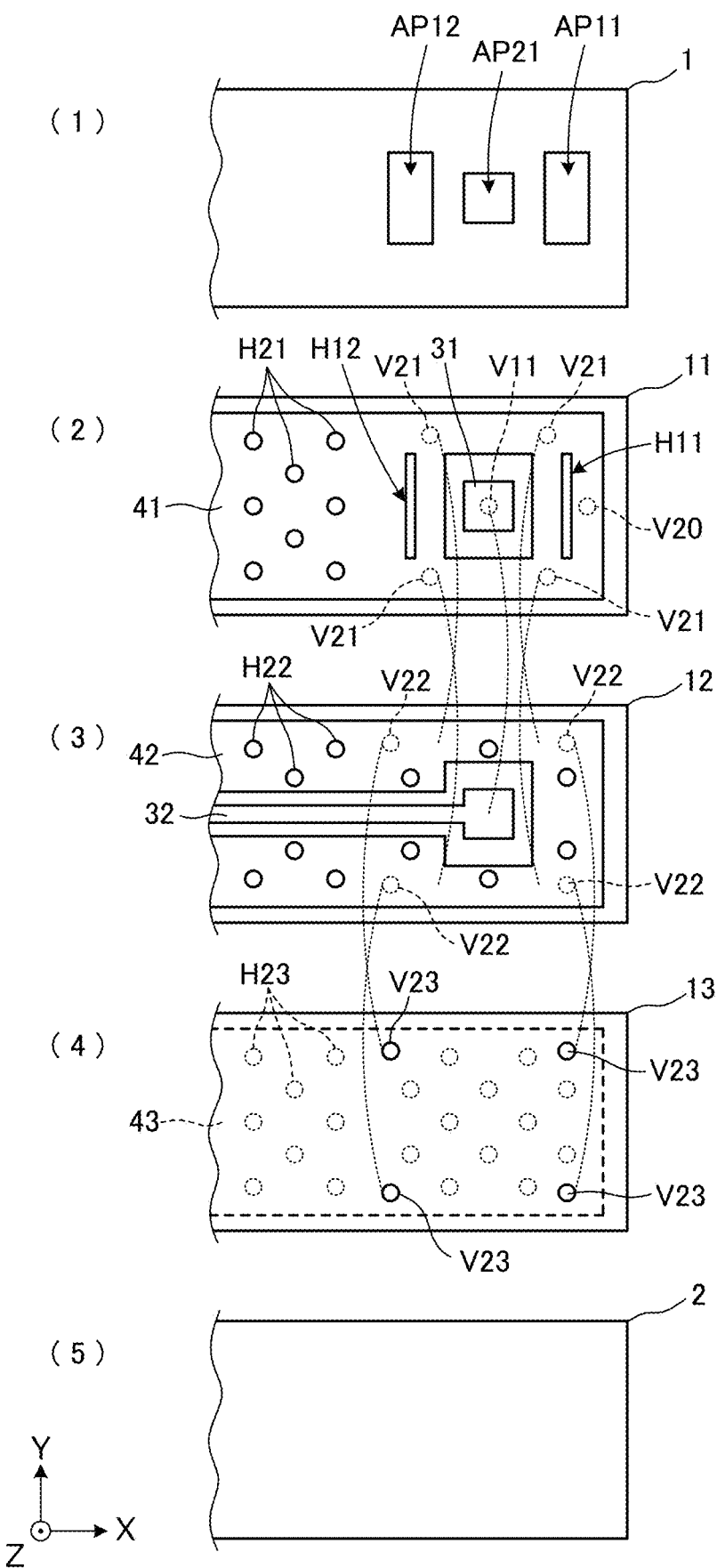

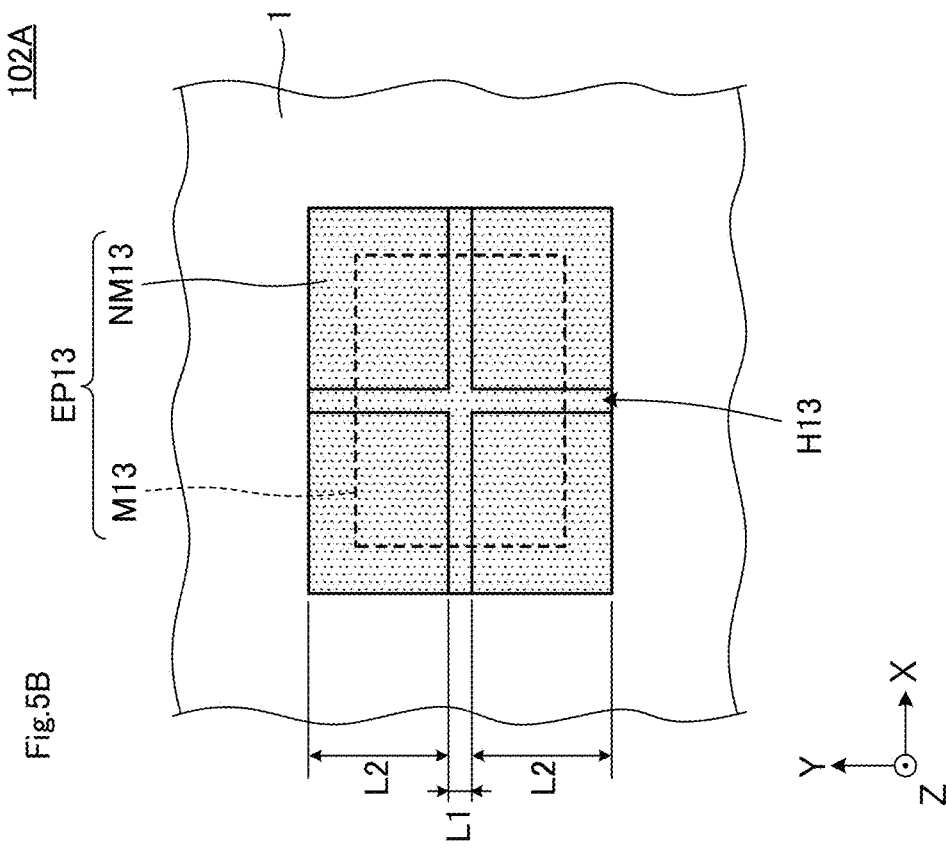
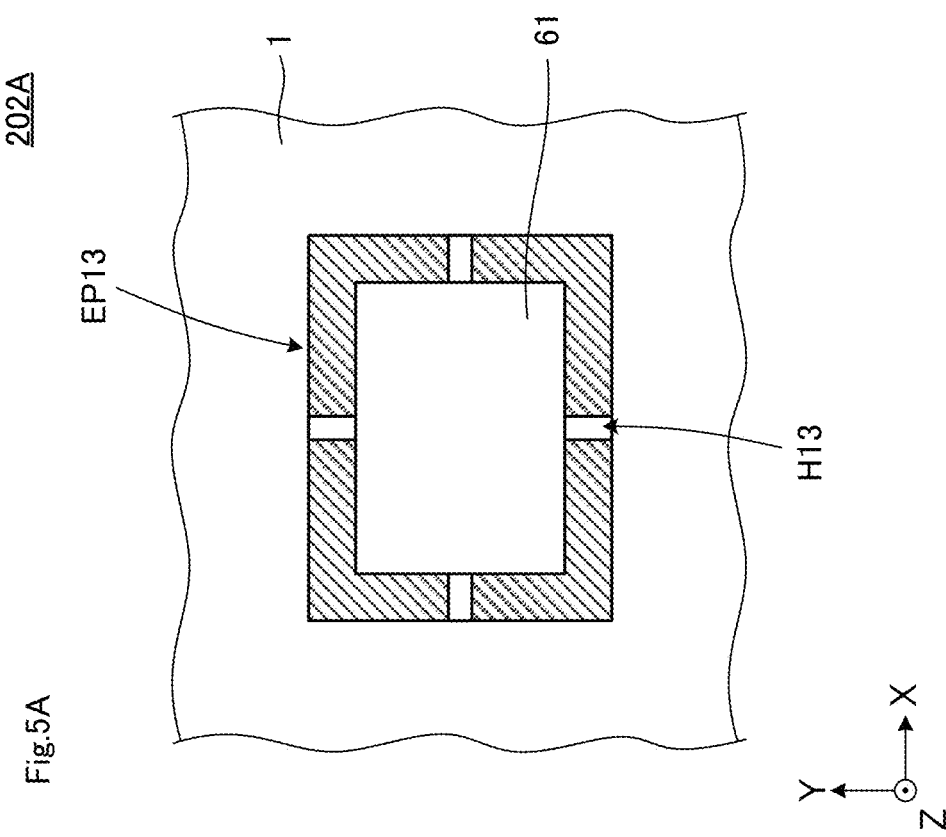

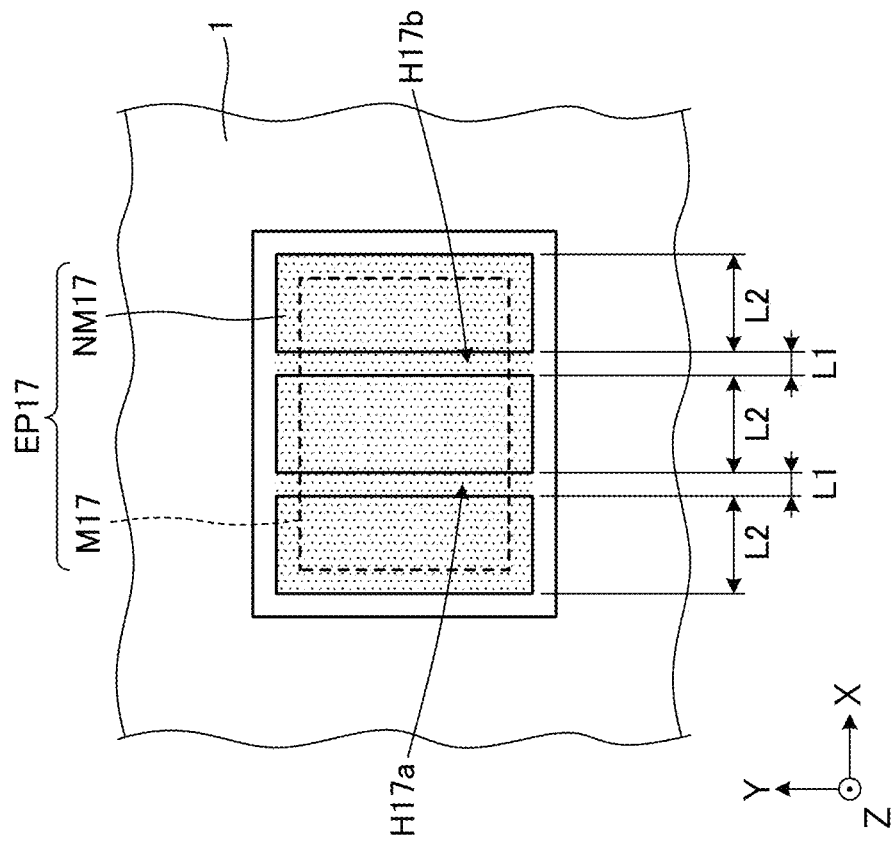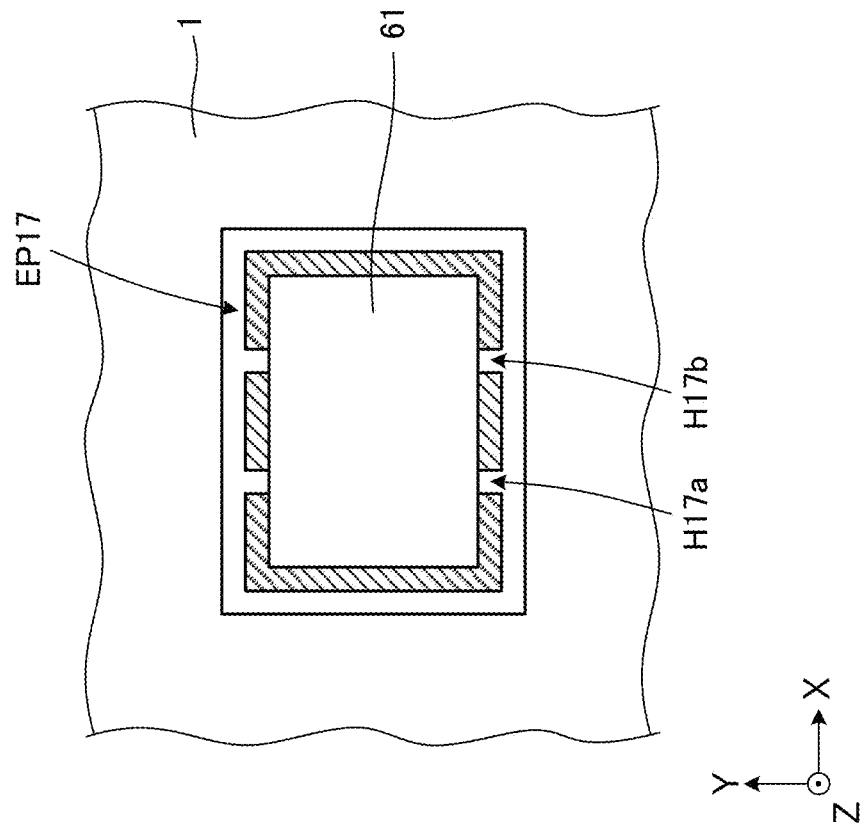

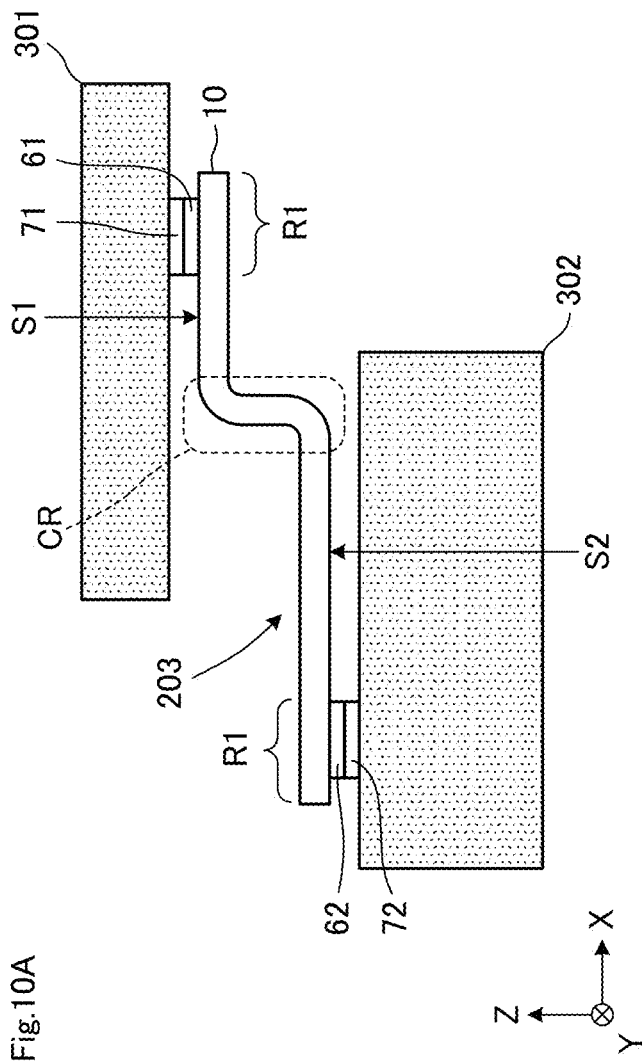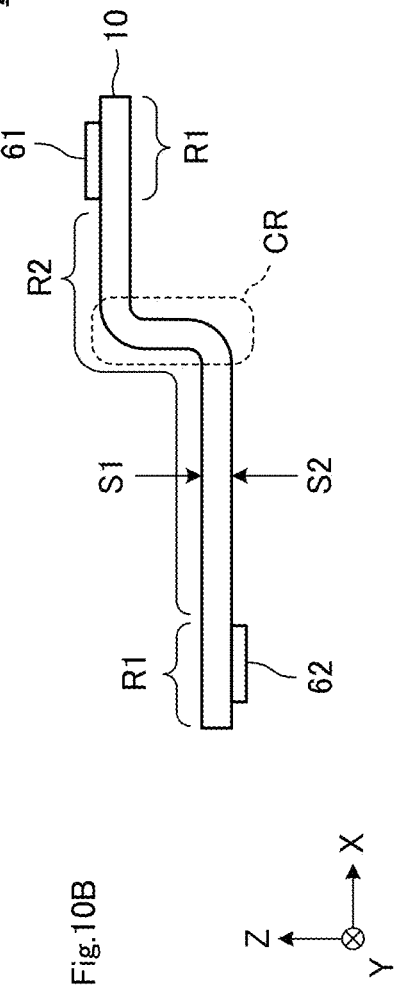

MULTILAYER SUBSTRATE AND ELECTRIC ELEMENT

CROSS REFERENCE TO RELATED APPLICATIONS

This application claims the benefit of priority to Japanese Patent Application No. 2018-025186 filed on Feb. 15, 2018 and is a Continuation Application of PCT Application No. PCT/JP2018/046079 filed on Dec. 14, 2018. The entire contents of each application are hereby incorporated herein by reference.

BACKGROUND OF THE INVENTION

1. Field of the Invention

The present invention relates to a multilayer substrate including a stacked body including a plurality of insulating base material layers stacked on each other and an electrode to mount a component provided on a surface of the stacked body, and an electric element including the multilayer substrate and a mounted component mounted on the multilayer substrate.

2. Description of the Related Art

In general, when a resin base material configuring a multilayer substrate receives heat of a predetermined temperature or higher, a portion of the resin base material is thermally decomposed and produces gas such as $CO_2$, and water. In addition, oxygen to be generated when an oxidized conductor pattern causes reduction reaction with heat and carbon in a thermoplastic resin undergo oxidation reaction, and produce $CO_2$. Furthermore, a component of a stacked body absorbs moisture in a manufacturing process. When the multilayer substrate is heated while such gas and water are left in the multilayer substrate, the gas (gas or vapor) expands and interlayer peeling (delamination) occurs. Therefore, normally, when a multilayer substrate is formed, heating and pressing are performed under reduced pressure, and a predetermined preheating process is provided to discharge gas out of a stacked body during heating and pressing.

However, when the multilayer substrate has a conductor pattern (a metal pattern) having a large area, the gas is unable to penetrate the conductor pattern. Therefore, depending on a location at which the gas has been produced, there is a possibility that the gas may remain in the multilayer substrate. Then, residual gas expands by heating when a multilayer substrate is manufactured or mounted to another substrate, and there is still a possibility that interlayer peeling may occur.

For example, Japanese Unexamined Patent Application Publication No. 2005-136347 discloses a structure in which a very small degassing hole (a through hole) is provided in a conductor pattern having a large area. In this structure, gas produced inside a multilayer substrate at heating is discharged through the degassing hole. In other words, the amount of gas remaining in the multilayer substrate is reduced, and interlayer peeling occurring at the heating is reduced.

It is also conceivable that such an opening (a degassing hole) may be provided in a mounting electrode. However, in such a case, when a mounted component is attempted to be bonded to the mounting electrode using a conductive bonding material (solder or the like), a non-metal component (flux, for example) included in the conductive bonding material may remain in the opening. Then, the non-metal component volatilizes due to the heat at a time of bonding, and the conductive bonding material easily bursts. Therefore, there is a possibility that bonding failure or conduction failure may occur in a bonding portion in which a mounting electrode and a mounted component are bonded.

SUMMARY OF THE INVENTION

Preferred embodiments of the present invention provide multilayer substrates that are each able to significantly reduce or prevent a burst or the like in a bonding portion between a mounting electrode and a mounted component at a time of bonding and are each able to significantly reduce or prevent bonding failure or conduction failure in the bonding portion, in a structure in which an opening is provided in the mounting electrode.

A multilayer substrate according to a preferred embodiment of the present invention includes a stacked body including a plurality of insulating base material layers stacked on each other and a mounting surface, a conductor pattern that is provided in contact with at least one of the plurality of insulating base material layers and includes a mounting electrode provided on the mounting surface, and the mounting electrode includes a first opening, and the first opening, in a plan view of the mounting surface, is provided over a mounting region and a non-mounting region of the mounting electrode, the mounting region, when a mounted component is mounted, overlapping with the mounted component, the non-mounting region not overlapping with the mounted component.

Accordingly, at a time of bonding the mounted component and the mounting electrode by a conductive bonding material, a non-metal component included in the conductive bonding material, or volatile gas of the non-metal component escapes from the first opening. In other words, the non-metal component or the volatile gas of the non-metal component is emitted outside, without remaining in the bonding portion at the time of bonding. Therefore, a burst of the conductive bonding material or generation of a void at the time of bonding is significantly reduced or prevented, and bonding failure or conduction failure in the bonding portion is significantly reduced or prevented.

The plurality of insulating base material layers may include a resin as a main material. In a case in which the multilayer substrate is a resin multilayer substrate including a conductor pattern, that is, in a case in which the stacked body (the resin multilayer substrate) includes a conductor pattern, gas produced in the stacked body in a manufacturing stage is difficult escape to the outside. Therefore, interlayer peeling due to residual gas easily occurs at a time of heating in the manufacturing stage or operational stage of the multilayer substrate. Accordingly, in the case of a resin multilayer substrate including a conductor pattern, the structure in which an opening is provided in a conductor pattern is effective in that the interlayer peeling due to the residual gas is significantly reduced or prevented.

The first opening may be linear or substantially linear, and, in a direction perpendicular or substantially perpendicular to an extending direction of the first opening, a conductor width of the mounting electrode may be about 1 mm or less, and an opening width of the first opening may be about 0.1 mm or less and may be about 1/50 or more of the conductor width of the mounting electrode. Accordingly, a multilayer substrate that is able to provide the bonding strength between the mounting electrode and the mounted component while significantly reducing or preventing the interlayer peeling due to the residual gas in the stacked body is able to be provided.

The conductor pattern may include a plurality of conductor patterns, and the first opening may be provided in a largest conductor pattern among the plurality of conductor patterns. When a large conductor pattern is in the stacked body, depending on a location at which gas has been produced, a discharge path of the gas to the outside of the multilayer substrate becomes longer, and the gas may remain in the stacked body. Therefore, the first opening is provided in the largest conductor pattern, and the gas produced in the stacked body at the time of heating is able to be effectively discharged to the outside.

The conductor pattern, in the plan view of the mounting surface, may include a second opening of which the periphery is surrounded by a conductor. Accordingly, the gas produced in the stacked body in the manufacturing stage promptly escapes from the second opening provided in a ground conductor before traveling a comparatively long distance to the outside. Therefore, the amount of the gas remaining in the stacked body is significantly reduced, and the interlayer peeling at a time of heating in the manufacturing stage or operational stage of the multilayer substrate is significantly reduced or prevented. The second opening of which the periphery is surrounded by a conductor is provided in the conductor pattern, and the conductor pattern is able to be significantly reduced or prevented from being divided and isolated. Therefore, influence on electrical characteristics due to a provided opening is able to be significantly reduced.

The conductor pattern may include a surface layer pattern located on an outermost layer in a stacking direction of the plurality of insulating base material layers, and an inner layer pattern located on an inner layer further inside than the surface layer pattern, and the surface layer pattern may include the second opening. The amount of gas produced on the surface layer of the stacked body to which heat is easily applied from the outside and of which the temperature easily rises is relatively large. Therefore, the gas produced from the surface layer of the stacked body is able to be effectively extracted, compared with a case in which a surface layer pattern includes no second opening.

The inner layer pattern may include the second opening. The gas produced in the stacked body tends to be guided from the inside to the surface layer. Therefore, the second opening is provided in both the surface layer pattern and the inner layer pattern, and gas is able to be efficiently extracted from the surface layer of the stacked body.

The second opening may include a plurality of second openings, and the plurality of second openings, in the plan view of the mounting surface, may be provided at equal or substantially equal intervals from each other. Accordingly, the deviation of the distribution of the openings is significantly reduced, and the degassing effect easily becomes uniform in a planar direction. In other words, the gas may not remain locally, and the effect of significantly reducing or preventing the interlayer peeling is significantly improved.

The conductor pattern may include a plurality of conductor patterns, and the second opening may be provided in a largest conductor pattern among the plurality of conductor patterns. When a large conductor pattern is in the stacked body, depending on a location at which gas has been produced, a discharge path of the gas to the outside of the multilayer substrate becomes longer, and the gas may remain in the stacked body. Therefore, the second opening is provided in the largest conductor pattern, and the gas produced in the stacked body at the time of heating is able to be effectively discharged to the outside.

The stacked body may include a bent portion to be bent, and a distance between at least one of the plurality of second openings and the bent portion may be smaller than a distance between the first opening and the bent portion. When bending stress is applied to the conductor pattern including the opening, a tear or a crack easily occurs starting from the opening. As a result, peeling of a conductor pattern or interlayer peeling, or degradation of electrical characteristics easily occurs. Accordingly, the first opening is spaced apart from a bent portion CR, and the occurrence of a tear or a crack starting from the first opening due to bending stress is significantly reduced or prevented. As a result, the occurrence of peeling of a mounting electrode, the interlayer peeling adjacent to or in a vicinity of the mounting electrode, or the like is able to be significantly reduced or prevented.

The stacked body may include a bent portion to be bent, and the first opening and the second opening are may be located in portions other than the bent portion. Accordingly, the occurrence of a tear or a crack starting from the first opening and the second opening is further significantly reduced or prevented, and, as a result, the occurrence of peeling of a conductor pattern or interlayer peeling, or degradation of electrical characteristics is able to be further significantly reduced or prevented.

The multilayer substrate may include an interlayer connection conductor provided, among the plurality of insulating base material layers, in an insulating base material layer on which the mounting electrode is provided, the interlayer connection conductor including a resin material, and the interlayer connection conductor, in the plan view of the mounting surface, may overlap with the mounting electrode. The interlayer connection conductor (a via conductor) including a resin material includes a large amount of the gas produced at a time of heating in the manufacturing stage or operational stage (at a time of bonding, in particular) of the multilayer substrate. Therefore, when an interlayer connection conductor is located adjacent to or in a vicinity of the mounting electrode, a burst of a conductive bonding material easily occurs at the time of bonding, and interlayer peeling at the time of heating in the manufacturing stage or operational stage of the multilayer substrate easily occurs. On the other hand, according to the structure described above, the gas produced from the interlayer connection conductor at the time of heating in the manufacturing stage or operational stage of the multilayer substrate is able to be efficiently discharged. Therefore, the burst of the conductive bonding material at the time of bonding is significantly reduced or prevented, and the interlayer peeling adjacent to or in a vicinity of the mounting electrode at the time of heating in the manufacturing stage or operational stage of the multilayer substrate is significantly reduced or prevented.

An electric element according to a preferred embodiment of the present invention includes a multilayer substrate according to a preferred embodiment of the present invention, and the mounted component mounted on the mounting surface and connected to the mounting electrode.

Accordingly, an electronic device that significantly reduces or prevents a burst in a bonding portion between a mounting electrode and a mounted component at the time of bonding, and significantly reduces or prevents bonding failure or conduction failure in the bonding portion is able to be provided.

According to preferred embodiments of the present invention, a multilayer substrate that is able to significantly reduce or prevent a burst or the like in a bonding portion between a mounting electrode and a mounted component at a time of bonding and able to significantly reduce or prevent bonding failure or conduction failure in the bonding portion, in a structure in which an opening is provided in a mounting electrode, is able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of an electric element 201 according to a first preferred embodiment of the present invention.

FIG. 3A is an enlarged plan view showing a first end of a multilayer substrate 101 according to the first preferred embodiment of the present invention, and FIG. 3B is an enlarged sectional view showing the first end of the multilayer substrate 101.

FIG. 4 is an exploded plan view of the multilayer substrate 101.

FIG. 5A is a plan view showing a mounting electrode EP13 on which a connector 61 is mounted, in an electric element 202A according to a second preferred embodiment of the present invention, and FIG. 5B is a plan view showing the mounting electrode EP13 of a multilayer substrate 102A according to the second preferred embodiment of the present invention.

FIG. 9A is a plan view showing a mounting electrode EP17 on which a connector 61 is mounted, in an electric element 202E according to the second preferred embodiment of the present invention, and FIG. 9B is a plan view showing the mounting electrode EP17 of a multilayer substrate 102E according to the second preferred embodiment of the present invention.

FIG. 10A is a front view showing a main portion of an electronic device 401 according to a third preferred embodiment of the present invention, and FIG. 10B is a front view of an electric element 203 according to the third preferred embodiment of the present invention.

DETAILED DESCRIPTION OF THE PREFERRED EMBODIMENTS

Figure 2A:
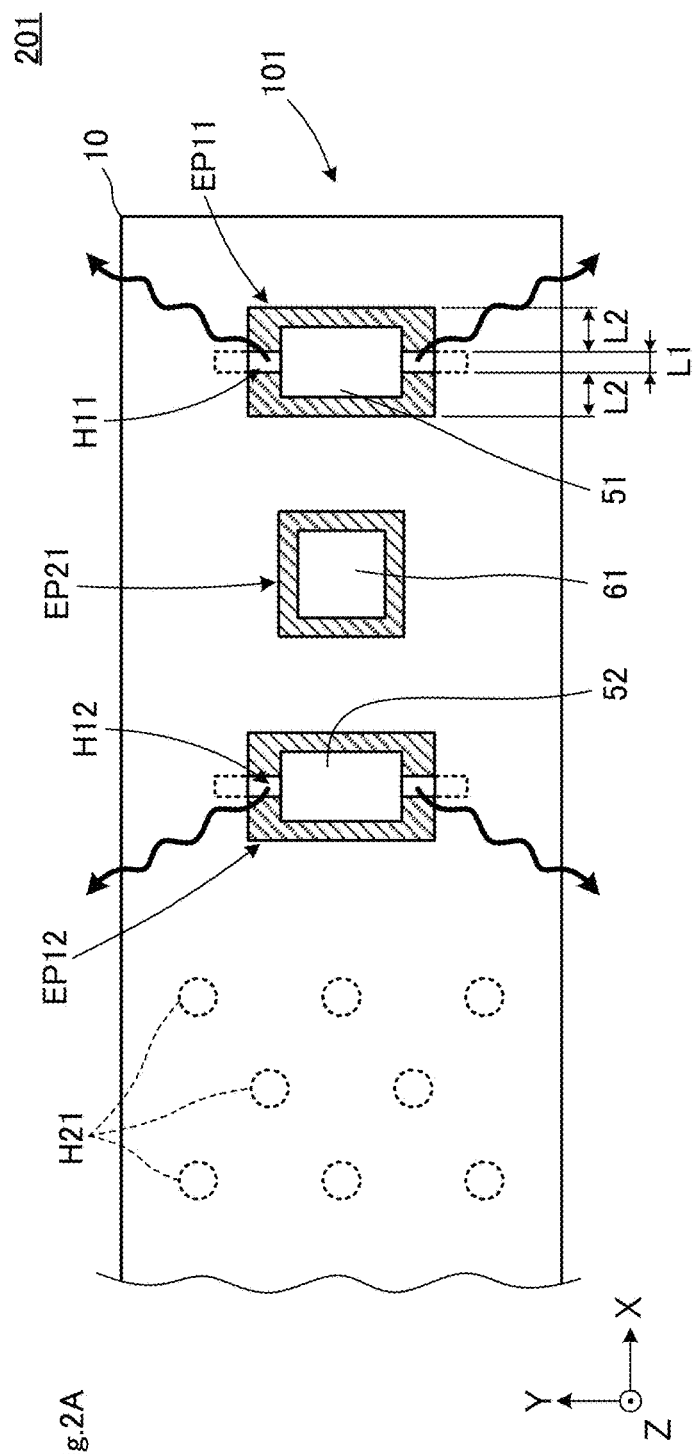
FIG. 2A is an enlarged plan view showing a first end of the electric element 201.

Hereinafter, preferred embodiments of the present invention will be described with reference to the attached drawings and several specific examples. In the drawings, components and elements assigned with the same reference numerals or symbols will represent the same or corresponding components and elements. While preferred embodiments of the present invention are divided and described for the sake of convenience in consideration of ease of description or understanding of main points, elements described in different preferred embodiments are able to be partially replaced and combined with each other. In second and subsequent preferred embodiments, a description of matters common to the first preferred embodiment will be omitted and only different points will be described. In particular, the same or substantially the same advantageous functions and effects by the same or similar features, components, and elements will not be described one by one for each preferred embodiment.

First Preferred Embodiment

Figure 2B:
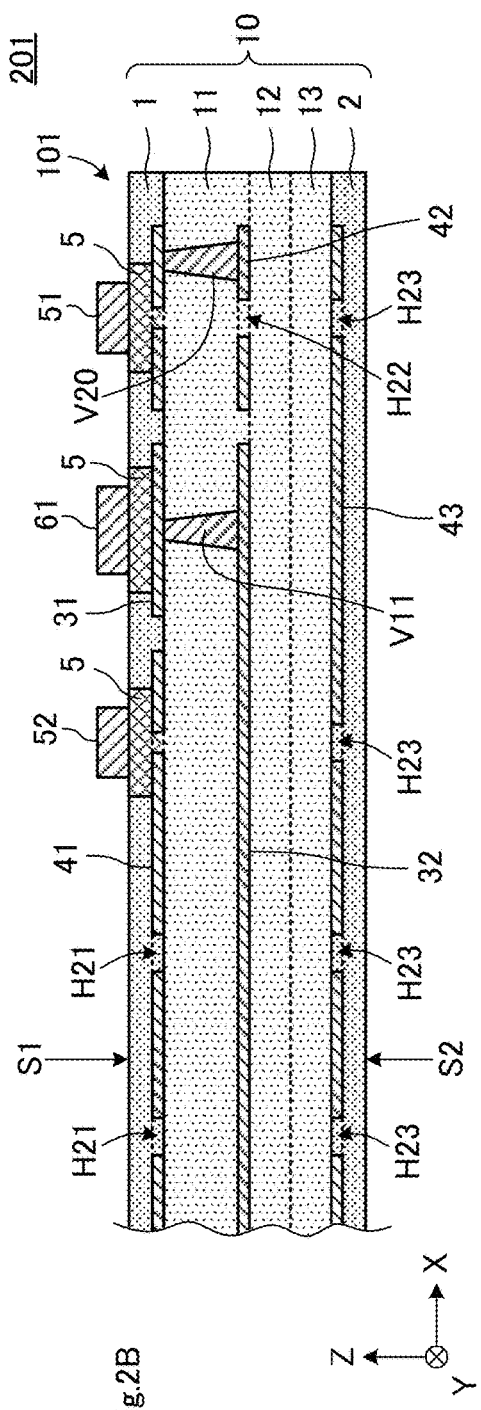
FIG. 2B is an enlarged sectional view showing the first end of the electric element 201.

FIG. 1 is an external perspective view of an electric element 201 according to a first preferred embodiment of the present invention. FIG. 2A is an enlarged plan view showing a first end of the electric element 201, and FIG. 2B is an enlarged sectional view showing the first end of the electric element 201. FIG. 3A is an enlarged plan view showing a first end of a multilayer substrate 101 according to the first preferred embodiment, and FIG. 3B is an enlarged sectional view showing the first end of the multilayer substrate 101. FIG. 4 is an exploded plan view of the multilayer substrate 101. In FIG. 2A, a conductor portion of mounting electrodes EP11, EP12, and EP21 is indicated by hatching. In FIG. 3A, the mounting electrodes EP11, EP12, and EP21 are indicated by a dot pattern, and mounting regions M11, M12, and M21 are indicated by a dashed line.

The electric element 201 is an electronic component in which connectors 51, 52, 53, 54, 61, and 62 are mounted on the multilayer substrate 101. The electric element 201 according to the first preferred embodiment of the present invention may be a cable that connects other circuit boards to each other, for example.

In the first preferred embodiment, the connectors 51, 52, 53, 54, 61, and 62 correspond to the "mounted component".

The multilayer substrate 101 includes a stacked body 10, a plurality of conductor patterns (to be described in detail later), and interlayer connection conductors V11, V20, V21, V22, and V23. The plurality of conductor patterns include signal conductors 31 and 32, and ground conductors 41, 42, and 43.

The stacked body 10 is a rectangular or substantially rectangular insulated flat plate of which the longitudinal direction coincides with an X-axis direction. The stacked body 10 includes a first surface S1 and a second surface S2 that are opposite to each other. As shown in FIG. 1, the connectors 51, 52, 53, 54, 61, and 62 are mounted on the first surface S1 of the stacked body 10. Specifically, as mainly shown in FIG. 2A and FIG. 2B, the connectors 51, 52, and 61 are electrically connected to the mounting electrodes EP11, EP12, and EP21, respectively, through a conductive bonding material 5, for example, solder. Although not shown, the same or similar features apply to the connectors 53, 54, and 62.

In the first preferred embodiment, the first surface S1 corresponds to the "mounting surface". While the first preferred embodiment provides an example in which the connectors 51, 52, and 61 are respectively connected to the mounting electrodes EP11, EP12, and EP21, one connector may be connected to the mounting electrodes EP11, EP12, and EP21. The same or similar features also apply to the mounting electrode to be connected to the connectors 53, 54, and 62.

The mounting electrodes EP11, EP12, and EP21 are conductor patterns of which the outline is rectangular or substantially rectangular, and are exposed to the first surface S1 (provided on the first surface S1). As mainly shown in FIG. 3B, the mounting electrodes EP11 and EP12 are portions of the ground conductor 41, and the mounting electrode EP21 is a portion of the signal conductor 31. In addition, as mainly shown in FIG. 3A, the mounting electrode EP11 includes a first opening H11, and the mounting electrode EP12 includes a first opening H12.

In addition, the stacked body 10 has a structure in which a protective layer 2, a plurality of insulating base material layers 13, 12, and 11, and a protective layer 1 are stacked in order, and is flexible. The first surface S1 and the second surface S2 are perpendicular or substantially perpendicular to a stacking direction (a Z-axis direction) of the plurality of insulating base material layers 11, 12, and 13. The plurality of insulating base material layers 11, 12, and 13 are rectangular or substantially rectangular flat plates made of, for example, a resin as a main material and has a longitudinal direction that coincides with the X-axis direction. The plurality of insulating base material layers 11, 12, and 13 may be sheets preferably made of a thermoplastic resin, for example, liquid crystal polymer (LCP) or polyetheretherketone (PEEK). The protective layers 1 and 2 may preferably be epoxy resin films, for example.

As will be described in detail later (see "other preferred embodiments"), the plurality of insulating base material layers 11, 12, and 13, may preferably be a dielectric ceramic layer, for example, low temperature co-fired ceramics (LTCC: Low Temperature Co-fired Ceramics).

The signal conductor 31, the ground conductor 41, and the like are provided on the front surface of the insulating base material layer 11. The signal conductor 31 is a rectangular or substantially rectangular conductor pattern that is located adjacent to or in a vicinity of a first end (the right end portion of the insulating base material layer 11 in FIG. 4) of the insulating base material layer 11. The ground conductor 41 is a conductor pattern provided on the entire or substantially the entire surface of the insulating base material layer 11, and includes an opening portion at a position corresponding to the signal conductor 31. The signal conductor 31 and the ground conductor 41 may be conductor patterns, for example, Cu foil.

The ground conductor 41 includes first openings H11 and H12, and a plurality of second openings H21. The first openings H11 and H12 are linear or substantially linear through holes of which the periphery is surrounded by a conductor (the ground conductor 41), the through holes extending in a Y-axis direction. The plurality of second openings H21 are circular or substantially circular through holes of which the periphery is surrounded by a conductor (the ground conductor 41). The plurality of second openings H21, in a plan view of the mounting surface (when viewed in the Z-axis direction), are staggered at equal or substantially equal intervals from each other.

In addition, the insulating base material layer 11 includes the interlayer connection conductors V11, V20, and V21. The interlayer connection conductor V11 is connected to the signal conductor 31, and each of the interlayer connection conductors V20 and V21 is connected to the ground conductor 41. The interlayer connection conductors V11, V20, and V21 may be via conductors provided, for example, by forming a through hole in the insulating base material layer 11, filling the through hole with conductive paste including metal powder including Cu and Sn or an alloy including Cu and Sn, and a resin material, and then solidifying the conductive paste through a heating and pressing process.

The signal conductor 32, the ground conductor 42, and the like are provided on the front surface of the insulating base material layer 12. The signal conductor 32 is a linear or substantially linear conductor pattern extending in the X-axis direction. One end (the right end portion of the signal conductor 32 in FIG. 4) of the signal conductor 32 is electrically connected to the signal conductor 31 through the interlayer connection conductor V11. The ground conductor 42 is a conductor pattern provided on the entire or substantially the entire surface of the insulating base material layer 12, and includes an opening portion at a position corresponding to the signal conductor 32. The ground conductor 42 is electrically connected to the ground conductor 41 through the interlayer connection conductors V20 and V21. The signal conductor 32 and the ground conductor 42 may be conductor patterns, for example, Cu foil.

The ground conductor 42 includes a plurality of second openings H22. The plurality of second openings H22 are circular or substantially circular through holes of which the periphery is surrounded by a conductor (the ground conductor 42). The plurality of second openings H22, in a plan view of the mounting surface (when viewed in the Z-axis direction), are staggered at equal or substantially equal intervals from each other.

In addition, the insulating base material layer 12 includes a plurality of interlayer connection conductors V22. Each of the plurality of interlayer connection conductors V22 is connected to the ground conductor 42. The interlayer connection conductor V22 may be a via conductor provided, for example, by forming a through hole in the insulating base material layer 12, filling the through hole with conductive paste including metal powder including Cu and Sn or an alloy including Cu and Sn, and a resin material, and then solidifying the conductive paste through a heating and pressing process.

The ground conductor 43 is provided on the back surface of the insulating base material layer 13. The ground conductor 43 is a conductor pattern provided on the entire or substantially the entire surface of the insulating base material layer 13. As shown in FIG. 4, the ground conductor 43 includes a plurality of second openings H23. The plurality of second openings H23 are circular or substantially circular through holes of which the periphery is surrounded by a conductor (the ground conductor 42). The plurality of second openings H23, in a plan view of the mounting surface (when viewed in the Z-axis direction), are staggered at equal or substantially equal intervals from each other. The ground conductor 43 may be a conductor pattern, for example, Cu foil.

In addition, the insulating base material layer 13 includes a plurality of interlayer connection conductors V23. The ground conductor 43 is electrically connected to the ground conductor 42 through the interlayer connection conductors V22 and V23. The interlayer connection conductor V23 may be a via conductor provided, for example, by forming a through hole in the insulating base material layer 13, filling the through hole with conductive paste including metal powder including Cu and Sn or an alloy including Cu and Sn, and a resin material, and then solidifying the conductive paste through a heating and pressing process.

The protective layer 1 has the same or substantially the same shape in a plan view as the insulating base material layer 11, and is stacked on the front surface of the insulating base material layer 11. As shown in FIG. 4, the protective layer 1 includes opening portions AP11, AP12, and AP21 at positions corresponding to the position of the signal conductor 31 and the like. Therefore, the protective layer 1 is provided on the insulating base material layer 11, and a portion of the signal conductor 31 and portions of the ground conductor 41 are exposed to the first surface S1 of the stacked body 10. As shown in FIG. 3B, the portion of the signal conductor 31 exposed to the first surface S1 is the mounting electrode EP21. In addition, the portions of the ground conductor 41 exposed to the first surface S1 are the mounting electrodes EP11 and EP12. The protective layer 1 covers the portion of the signal conductor 31 and the portions of the ground conductor 41. In other words, the protective layer 1 has an over resist structure with respect to the mounting electrodes EP11, EP12, and EP21. The protective layer 2 has the same or substantially the same shape in a plan view as the insulating base material layer 13, and is stacked on the back surface of the insulating base material layer 13.

In the first preferred embodiment, the ground conductors 41 and 43 located on the outermost layer in the stacking direction (the Z-axis direction) of the plurality of insulating base material layers 11, 12, and 13 correspond to the "surface layer pattern". In addition, the ground conductor 42 located on an inner layer further inside than the ground conductors 41 and 43 corresponds to the "inner layer pattern".

As mainly shown in FIG. 3B, in the first preferred embodiment, the signal conductor 32, the ground conductors 41, 42, and 43, the insulating base material layer 11 interposed between the signal conductor 32 and the ground conductor 41, the insulating base material layers 12 and 13 interposed between the signal conductor 32 and the ground conductor 43 define a stripline transmission line.

As shown in FIG. 3A, the first opening H11, in a plan view of the mounting surface (when viewed in the Z-axis direction), is provided over (across) a mounting region M11 and a non-mounting region NM11 of the mounting electrode EP11. In addition, the first opening H12, when viewed in the Z-axis direction, is provided over (across) a mounting region M12 and a non-mounting region NM12 of the mounting electrode EP12. The "mounting region" refers to a region of the mounting electrode that, when a mounted component is mounted, overlaps with the mounted component, when viewed in the Z-axis direction. In addition, the "non-mounting region" refers to a region of the mounting electrode that, when a mounted component is mounted, does not overlap with the mounted component, when viewed in the Z-axis direction.

In the first preferred embodiment, an opening width L1 of the first opening H11 may preferably be about 0.1 mm, for example. In addition, a conductor width L2 of the mounting electrode EP11 may preferably be about 1 mm, for example.

Herein, the opening width L1 of the first opening refers to a width of a linear first opening in a direction perpendicular or substantially perpendicular to the extending direction. In addition, the conductor width L2 of the mounting electrode refers to (1) in a case in which the conductor portion of the mounting electrode has a rectangular shape, a length of the short side of the rectangular shape, or (2) in a case in which the first opening includes a plurality of first openings, a shortest distance between the first openings.

In addition, in the first preferred embodiment, as mainly shown in FIG. 3A and FIG. 3B, the interlayer connection conductor V20 including a resin material is provided on the insulating base material layer 11 (the insulating base material layer on which the mounting electrode EP11 is provided), and, in a plan view of the mounting surface (when viewed in the Z-axis direction), at least partially overlaps with the mounting electrode EP11.

According to the multilayer substrate 101 and the electric element 201 of the first preferred embodiment, the following advantageous effects are provided.

In a case in which the mounting electrode includes an opening, and a mounted component is attempted to be bonded to the mounting electrode by a conductive bonding material, a non-metal component (flux, for example) included in the conductive bonding material may remain in the opening, and the non-metal component may volatilize due to the heat at a time of bonding, and the conductive bonding material may burst. In addition, due to the volatile gas of the non-metal component, a void may also occur in the conductive bonding material after the bonding. Therefore, a reduction in bonding strength or conduction failure in a bonding portion in which a mounting electrode and a mounted component are bonded may occur. In a case in which a mounted component covers the entire or substantially the entire opening, in particular, the problem described above may easily occur. On the other hand, in the first preferred embodiment, the mounting electrodes EP11 and EP12 include the first openings H11 and H12 provided over the mounting regions M11 and M12 and the non-mounting regions NM11 and NM12. Accordingly, at a time of bonding the mounted component and the mounting electrode by a conductive bonding material, a non-metal component included in the conductive bonding material, or volatile gas of the non-metal component escapes (see an arrow in FIG. 2A) from the first openings H11 and H12. In other words, the non-metal component or the volatile gas of the non-metal component is emitted outside, without remaining in the bonding portion at the time of bonding. Therefore, a burst of the conductive bonding material or generation of a void at the time of bonding is significantly reduced or prevented, and bonding failure or conduction failure in the bonding portion is significantly reduced or prevented.

At the time of bonding the mounting electrode and the mounted component by a conductive bonding material, the conductive bonding material is difficult to spread into the first openings H11 and H12 that is not a conductor portion. Therefore, even when the amount of the conductive bonding material that bonds the mounting electrode and the mounted component is large, a path to emit the non-metal component and the volatile gas of the non-metal component to the outside is provided.

In the first preferred embodiment, the plurality of insulating base material layers 11, 12, and 13 are made of a resin (a thermoplastic resin, for example) as a main material. In a case in which the multilayer substrate 101 is a resin multilayer substrate including a conductor pattern, for example, Cu foil, that is, in a case in which the stacked body (the resin multilayer substrate) includes a conductor pattern, for example, Cu foil, gas produced in the stacked body in a manufacturing stage is difficult to be escaped to the outside.

Therefore, interlayer peeling due to residual gas easily occurs at a time of heating in the manufacturing stage or operational stage of the multilayer substrate. Accordingly, in a case of a resin multilayer substrate including a conductor pattern, in that the interlayer peeling due to the gas remaining in the stacked body is significantly reduced, the structure according to the first preferred embodiment in which the opening (the first opening or the second opening) is provided in the conductor pattern is effective.

In the first preferred embodiment, the conductor pattern (the ground conductor 41, 42, 43) includes a plurality of second openings H21, H22, and H23 of which the periphery is surrounded by a conductor. Accordingly, the gas produced in the stacked body in the manufacturing stage promptly escapes from the plurality of second openings H21, H22, and H23 provided in a ground conductor before traveling a comparatively long distance to the outside. Therefore, the amount of the gas remaining in the stacked body is significantly reduced, and the interlayer peeling at a time of heating in the manufacturing stage or operational stage of the multilayer substrate is significantly reduced or prevented. The plurality of second openings H21, H22, and H23 of which the periphery is surrounded by a conductor are provided in the conductor pattern, and the conductor pattern is able to be significantly reduced or prevented from being divided and isolated. Therefore, influence on electrical characteristics due to a provided opening is able to be significantly reduced.

In the first preferred embodiment, the ground conductors (the surface layer patterns) 41 and 43 include the plurality of second openings H21 and H23. The amount of gas produced on the surface layer of the stacked body 10 to which heat is easily applied from the outside and of which the temperature easily rises is relatively large. Therefore, with the structure described above, the gas produced from the surface layer of the stacked body 10 is able to be effectively extracted, compared with a case in which the surface layer patterns include no second opening.

In addition, in the first preferred embodiment, the ground conductor 42 (the inner layer pattern) in addition to the surface layer pattern also includes the plurality of second openings H22. The gas produced in the stacked body tends to be guided from the inside to the surface layer. Therefore, the plurality of second openings are provided in both the surface layer pattern and the inner layer pattern, and gas is able to be efficiently extracted from the surface layer of the stacked body 10.

In the first preferred embodiment, the plurality of second openings H21, H22, and H23 are provided periodically at equal or substantially equal intervals. Accordingly, the deviation of the distribution of the openings is significantly reduced, and the degassing effect easily becomes uniform in a planar direction. In other words, the gas may not remain locally, and the effect of significantly reducing or preventing the interlayer peeling is significantly improved. As long as the plurality of second openings H21, H22, and H23 are provided periodically at equal or substantially equal intervals, the plurality of second openings H21, H22, and H23 are not limited to being staggered. In addition, an array pitch (a distance between the plurality of second openings H21, a distance between the plurality of second openings H22, and a distance between the plurality of second openings H23) of the respective second openings H21, H22, and H23 may be different.

The plurality of second openings H21 and H23, in a plan view of the mounting surface (when viewed in the Z-axis direction), are preferably provided, for example, at positions that do not overlap with the signal conductor 32. Accordingly, a change in capacitance generated between the signal conductor 32 and the ground conductors 41 and 43 adjacent to each other in the stacking direction is able to be significantly reduced or prevented, and continuity of the characteristic impedance of the transmission line is able to be provided. In addition, the second openings H21 and H23 do not overlap with the signal conductor 32, when viewed in the Z-axis direction, and a problem, for example, increased unnecessary radiation from the transmission line to the outside or increased susceptibility to noise from the outside, due to the second openings H21 and H23 respectively provided in the ground conductors 41 and 43, is able to be significantly reduced or prevented.

In addition, in the first preferred embodiment, the largest ground conductor 43 among the conductor patterns includes the plurality of second openings H23. When a large conductor pattern is in the stacked body, depending on a location at which gas has been produced, a discharge path of the gas to the outside of the multilayer substrate becomes longer, and the gas may remain in the stacked body. Therefore, the second opening is provided in the largest conductor pattern, and the gas produced in the stacked body at the time of heating is able to be effectively discharged to the outside.

While the first preferred embodiment provides an example in which the largest conductor pattern (the ground conductor 43) among the plurality of conductor patterns includes only the second openings, the largest conductor pattern may include the first opening. The largest conductor pattern includes the first opening and the second opening, and the gas produced in the stacked body is able to be further effectively discharged to the outside, as compared with a case in which the largest conductor pattern includes only the first opening (or only the second opening).

In addition, in the first preferred embodiment, the interlayer connection conductor V20 including a resin material is provided on the insulating base material layer 11 (the insulating base material layer on which the mounting electrode EP11 is provided), and, when viewed in the Z-axis direction, at least partially overlaps with the mounting electrode EP11. The interlayer connection conductor (a via conductor) including a resin material includes a large amount of the gas produced at a time of heating in the manufacturing stage or operational stage (at a time of bonding, in particular) of the multilayer substrate. Therefore, when an interlayer connection conductor is located adjacent to or in a vicinity of the mounting electrode, the burst of a conductive bonding material easily occurs at the time of bonding, and the interlayer peeling easily occurs at the time of heating in the manufacturing stage or operational stage of the multilayer substrate. On the other hand, in the first preferred embodiment, the first opening H11 is provided in the mounting electrode EP11 located adjacent to or in a vicinity of the interlayer connection conductor V20 including a resin material, and the gas produced from the interlayer connection conductor V20 at the time of heating in the manufacturing stage or operational stage of the multilayer substrate 101 is able to be efficiently discharged. Therefore, a burst of the conductive bonding material at the time of bonding is significantly reduced or prevented, and the interlayer peeling adjacent to or in a vicinity of the mounting electrode EP11 at the time of heating in the manufacturing stage or operational stage of the multilayer substrate is significantly reduced or prevented. In addition, according to the structure described above, irregularities or curves adjacent to or in a vicinity of the mounting electrode EP11 due to interlayer peeling are significantly reduced, and the mountability of the multilayer substrate 101 to another circuit board is significantly increased.

In the first preferred embodiment, the interlayer connection conductors V11, V20, V21, V22, and V23 provided in the stacked body are via conductors provided by solidifying conductive paste including a resin material. The via conductors, since being simultaneously provided by the heating and pressing process (as will be described herein) of the plurality of insulating base material layers 11, 12, and 13, are easy to be provided. In addition, the conductive paste includes a resin material, and high bondability between the insulating base material layer and the interlayer connection conductor that include a resin as a main material is able to be provided. The resin material included in the conductive paste is preferably the same or substantially the same as the resin material of the insulating base material layer, for example.

In the first preferred embodiment, the protective layers 1 and 2 are preferably epoxy resin films, for example. The epoxy resin has a higher gas permeability than liquid crystal polymer (LCP) or polyetheretherketone (PEEK) that is the main material of the insulating base material layer. Therefore, even when the protective layers 1 and 2 are provided, the gas permeability is hardly impaired.

In the first preferred embodiment, the first openings H11 and H12 included in the mounting electrodes EP11 and EP12 are linear or substantially linear. Accordingly, compared with a case in which a mounting electrode including a first opening that is bent (or curved) is provided, the mounting electrode is easily provided. In addition, in a case in which a mounting electrode includes a linear first opening that is bent (or curved), the non-metal component included in a conductive bonding material or the volatile gas (hereinafter referred to as a "non-metal component or the like") of the non-metal component easily remains in a bent portion, and the non-metal component or the like is not easily escaped from the first opening. Thus, according to the structure described above, compared with a case in which a linear first opening is bent (or curved), the non-metal component or the like easily escapes from the first opening, and a burst of the conductive bonding material or generation of a void at the time of bonding is further significantly reduced or prevented. In addition, according to the structure described above, compared with the case in which a linear first opening is bent, the interlayer peeling due to the gas produced in the stacked body, at a time of heating in the manufacturing stage or operational stage of the multilayer substrate, is significantly reduced or prevented.

In the first preferred embodiment, the opening width L1 of the first opening H11 is preferably about 0.1 mm, and the conductor width L2 of the mounting electrode EP11 is preferably about 1 mm, for example. In a case in which a width of a short side of a conductor portion exceeds about 1 mm, depending on a location at which gas has been produced in the stacked body, a discharge path of the gas to the outside of the multilayer substrate is long, and the produced gas is difficult to escape. On the other hand, the width of the first opening is large (in a case in which an area of the first opening is large), the bonding strength between the mounting electrode and the mounted component by a conductive bonding material is reduced. Therefore, the opening width L1 and the conductor width L2 are preferably, for example, values that satisfy the following conditions (1) to (3).

(1) The conductor width L2 is about 1 mm or less (L2 about 1 mm).

(2) The opening width L1 is about 0.1 mm or less (0<L1≤about 0.1 mm).

(3) The opening width L1 is about 1/50 or more of the conductor width L2 (L1≥about L2/50).

Accordingly, a multilayer substrate that is able to provide the bonding strength between the mounting electrode and the mounted component while significantly reducing or preventing the interlayer peeling due to the residual gas in the stacked body is able to be provided.

The multilayer substrate 101 according to the first preferred embodiment is preferably manufactured, for example, by the following processes.

First, the plurality of insulating base material layers 11, 12, and 13 that include a resin as a main material are prepared. The plurality of insulating base material layers 11, 12, and 13 may be sheets including a thermoplastic resin, for example, liquid crystal polymer (LCP) or polyetheretherketone (PEEK).

Subsequently, a conductor pattern (the signal conductors 31 and 32, the ground conductors 41, 42, 43, and the like) is provided on the plurality of insulating base material layers 11, 12, and 13. Specifically, metal foil (Cu foil, for example) is laminated on the front surface of the insulating base material layer 11 in a collective substrate state, and the metal foil is patterned by photolithography, for example, to form the signal conductor 31 and the ground conductor 41 on the front surface of the insulating base material layer 11. Metal foil (Cu foil, for example) is laminated on the front surface of the insulating base material layer 12 in a collective substrate state, and the metal foil is patterned by photolithography, for example, to form the signal conductor 32 and the ground conductor 42 on the front surface of the insulating base material layer 12. In addition, metal foil (Cu foil, for example) is laminated on the back surface of the insulating base material layer 13 in a collective substrate state, and the metal foil is patterned by photolithography, for example, to form the ground conductor 43 on the back surface of the insulating base material layer 13.

The ground conductor 41 includes first openings H11 and H12, and a plurality of second openings H21. In addition, the ground conductor 42 includes a plurality of second openings H22, and the ground conductor 43 includes a plurality of second openings H23. The first openings H11 and H12 are linear or substantially linear through holes extending in the Y-axis direction. The plurality of second openings H21, H22, and H23 are circular or substantially circular through holes of which the periphery is surrounded by a conductor (a ground conductor).

In addition, interlayer connection conductors V11, V20, V21, V22, and V23 are formed in the plurality of insulating base material layers 11, 12, and 13. The interlayer connection conductors V11, V20, V21, V22, and V23 are provided by forming a through hole with a laser and the like, for example, filling the through hole with conductive paste including metal powder including Cu and Sn or an alloy including Cu and Sn, and a resin material, and then solidifying the conductive paste by the subsequent heating and pressing process. Therefore, the conductive paste is preferably made of a material having a melting point (a melting temperature) lower than the temperature at the time of the subsequent heating and pressing process, for example.

Next, the protective layer 2, the insulating base material layers 13, 12, and 11, and the protective layer 1 are stacked in order, and the stacked insulating base material layers 11, 12, and 13, and the protective layers 1 and 2 are heated and pressed (collectively pressed) to form a stacked body in a collective substrate state. The stacked insulating base material layers 11, 12, and 13 are heated and pressed to form a stacked body in a collective substrate state, and then each of the protective layers 1 and 2 may be formed on the front surface of the stacked body.

The protective layer 1 includes a plurality of opening portions. Therefore, the protective layer 1 is provided on the insulating base material layer 11, and a portion of the signal conductor 31 and portions of the ground conductor 41 are exposed to the first surface S1 of the stacked body 10. In addition, the portion of the signal conductor 31 exposed to the first surface S1 is the mounting electrode EP21. The portions of the ground conductor 41 exposed to the first surface S1 are the mounting electrodes EP11 and EP12.

Next, connectors 51, 52, 61, and the like are mounted (bonded) to the mounting electrodes EP11, EP12, EP21, and the like. The mounting (bonding) of the connectors is preferably performed by a conductive bonding material, for example, solder. Subsequently, the stacked body in a collective substrate state is divided into pieces to provide individual multilayer substrates 101. The mounting and the dividing may be performed in reverse order.

According to this manufacturing method, a multilayer substrate that is able to significantly reduce or prevent a burst or the like in a bonding portion between a mounting electrode and a mounted component at a time of bonding of the mounted component and able to significantly reduce or prevent bonding failure or the like in the bonding portion is able to be easily manufactured.

In addition, according to this manufacturing method, since the stacked body 10 is able to be easily formed by collectively pressing the stacked insulating base material layers 11, 12, and 13, and the protective layers 1 and 2. Therefore, the number of manufacturing steps of the multilayer substrate 101 is able to be significantly reduced, and the cost is able to be reduced to a low level.

Second Preferred Embodiment

A second preferred embodiment of the present invention provides a modification of the first opening.

FIG. 5A is a plan view showing a mounting electrode EP13 on which a connector 61 is mounted, in an electric element 202A according to the second preferred embodiment, and FIG. 5B is a plan view showing the mounting electrode EP13 of a multilayer substrate 102A according to the second preferred embodiment. In FIG. 5A, a conductor portion of the mounting electrode EP13 is indicated by hatching. In addition, in FIG. 5B, the mounting electrode EP13 is indicated by a dot pattern, and a mounting region M13 is indicated by a dashed line.

The mounting electrode EP13 is different from the mounting electrode EP11 according to the first preferred embodiment in that a first opening H13 is provided. Other features of the mounting electrode EP13 are the same or substantially the same as the features of the mounting electrode EP11. As shown in FIG. 5B, the first opening H13 is a through hole having a cross (an X) shape extending in the X-axis direction and the Y-axis direction.

Figure 6A:
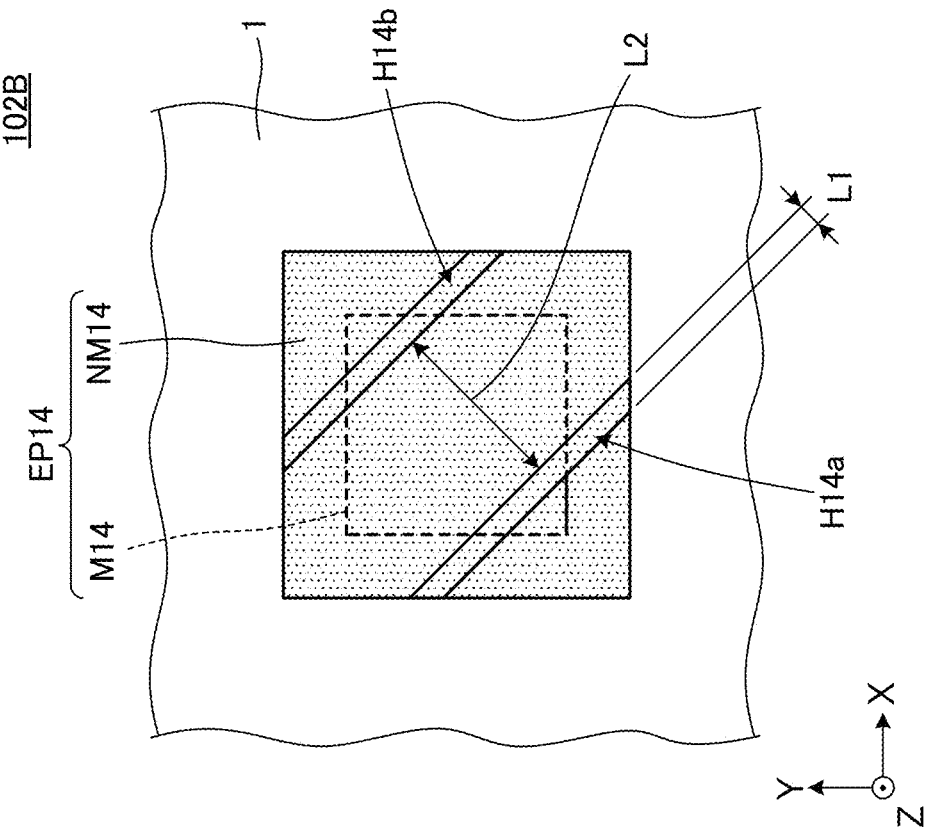
FIG. 6A is a plan view showing a mounting electrode EP14 on which a connector 61 is mounted, in an electric element 202B according to the second preferred embodiment of the present invention.
Figure 6B:
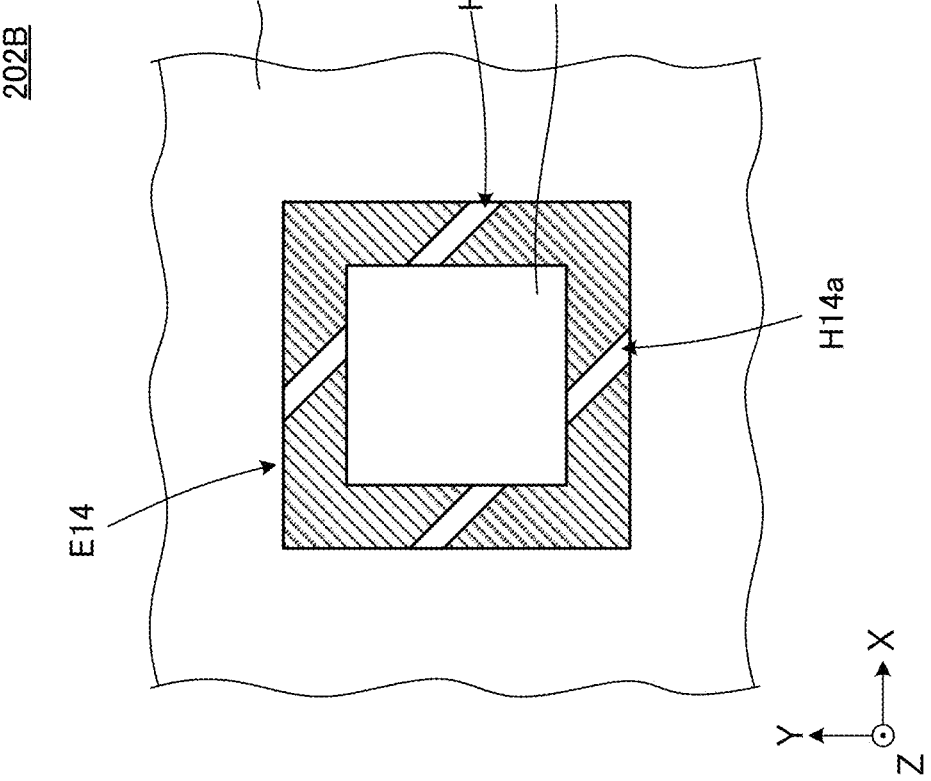
FIG. 6B is a plan view showing the mounting electrode EP14 of a multilayer substrate 102B according to the second preferred embodiment of the present invention.

FIG. 6A is a plan view showing a mounting electrode EP14 on which a connector 61 is mounted, in an electric element 202B according to the second preferred embodiment, and FIG. 6B is a plan view showing the mounting electrode EP14 of a multilayer substrate 102B according to the second preferred embodiment. In FIG. 6A, a conductor portion of the mounting electrode EP14 is indicated by hatching. In addition, in FIG. 6B, the mounting electrode EP14 is indicated by a dot pattern, and a mounting region M14 is indicated by a dashed line.

The mounting electrode EP14 is different from the mounting electrode EP11 according to the first preferred embodiment in that two first openings H14a and H14b are provided. Other features of the mounting electrode EP14 are the same or substantially the same as the features of the mounting electrode EP11. As shown in FIG. 6B, the first openings H14a and H14b are linear or substantially linear through holes extending in an oblique direction with respect to the X-axis direction (or the Y-axis direction). The first openings H14a and H14b are parallel or substantially parallel to each other.

Figure 7A:
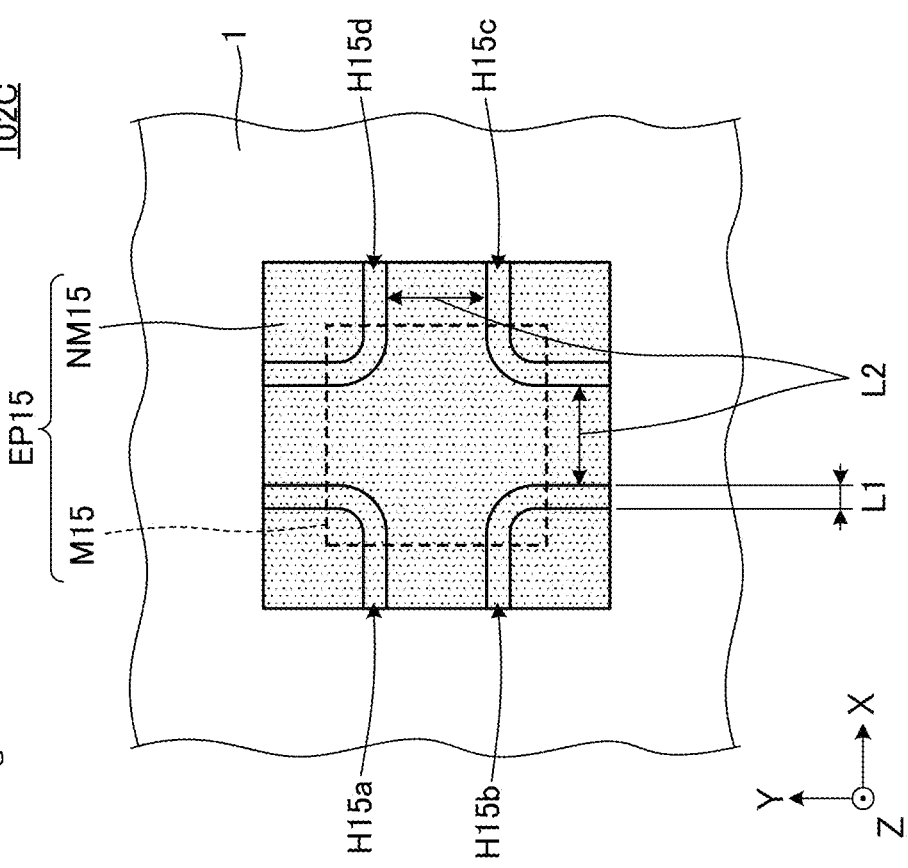
FIG. 7A is a plan view showing a mounting electrode EP15 on which a connector 61 is mounted, in an electric element 202C according to the second preferred embodiment of the present invention.
Figure 7B:
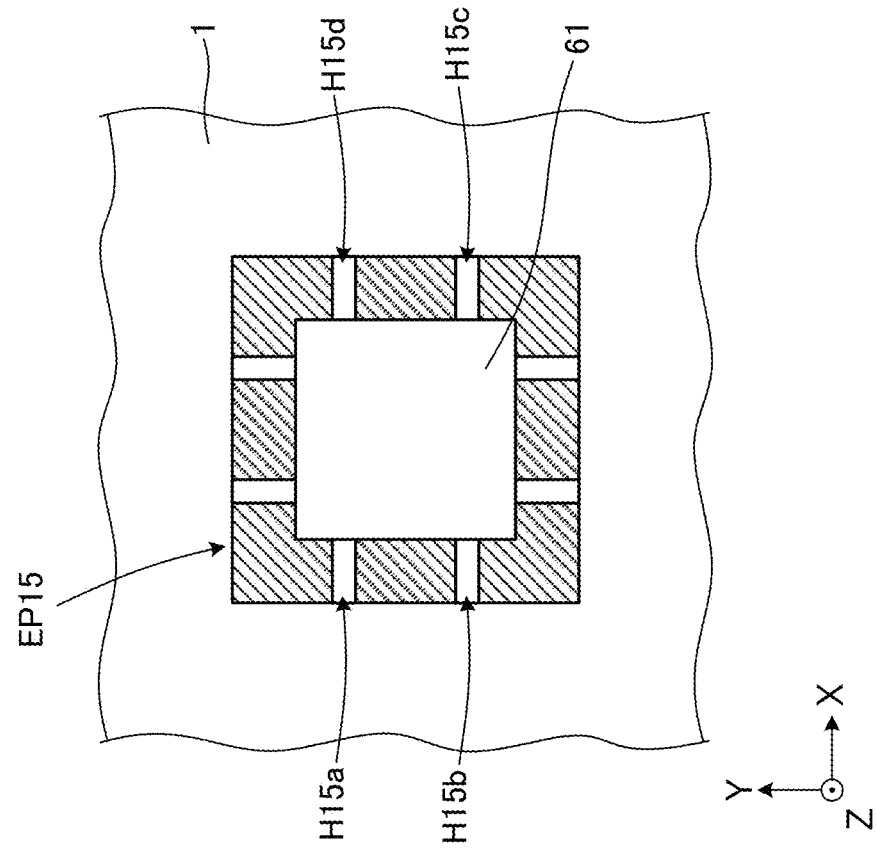
FIG. 7B is a plan view showing the mounting electrode EP15 of a multilayer substrate 102C according to the second preferred embodiment of the present invention.

FIG. 7A is a plan view showing a mounting electrode EP15 on which a connector 61 is mounted, in an electric element 202C according to the second preferred embodiment, and FIG. 7B is a plan view showing the mounting electrode EP15 of a multilayer substrate 102C according to the second preferred embodiment. In FIG. 7A, a conductor portion of the mounting electrode EP15 is indicated by hatching. In addition, in FIG. 7B, the mounting electrode EP15 is indicated by a dot pattern, and a mounting region M15 is indicated by a dashed line.

The mounting electrode EP15 is different from the mounting electrode EP11 according to the first preferred embodiment in that four first openings H15a, H15b, H15c, and H15d are provided. Other features of the mounting electrode EP15 are the same or substantially the same as the features of the mounting electrode EP11. As shown in FIG. 7B, the first openings H15a, H15b, H15c, and H15d are through holes bent in an L shape.

Figure 8B:
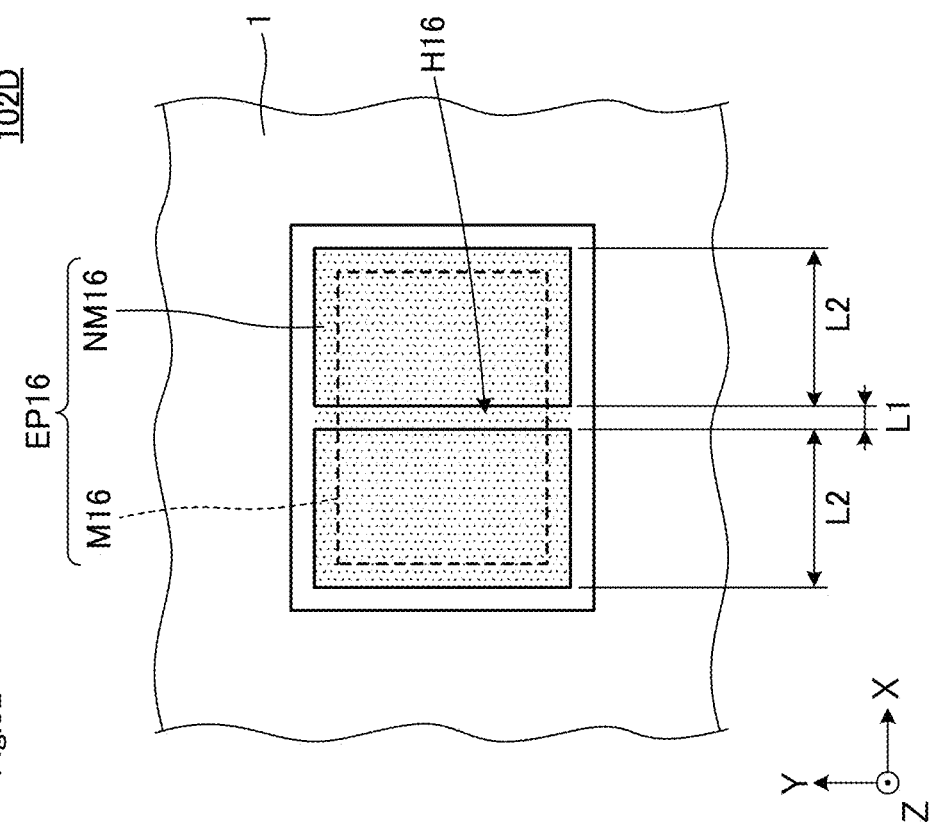
FIG. 8B is a plan view showing the mounting electrode EP16 of a multilayer substrate 102D according to the second preferred embodiment of the present invention.
Figure 8A:
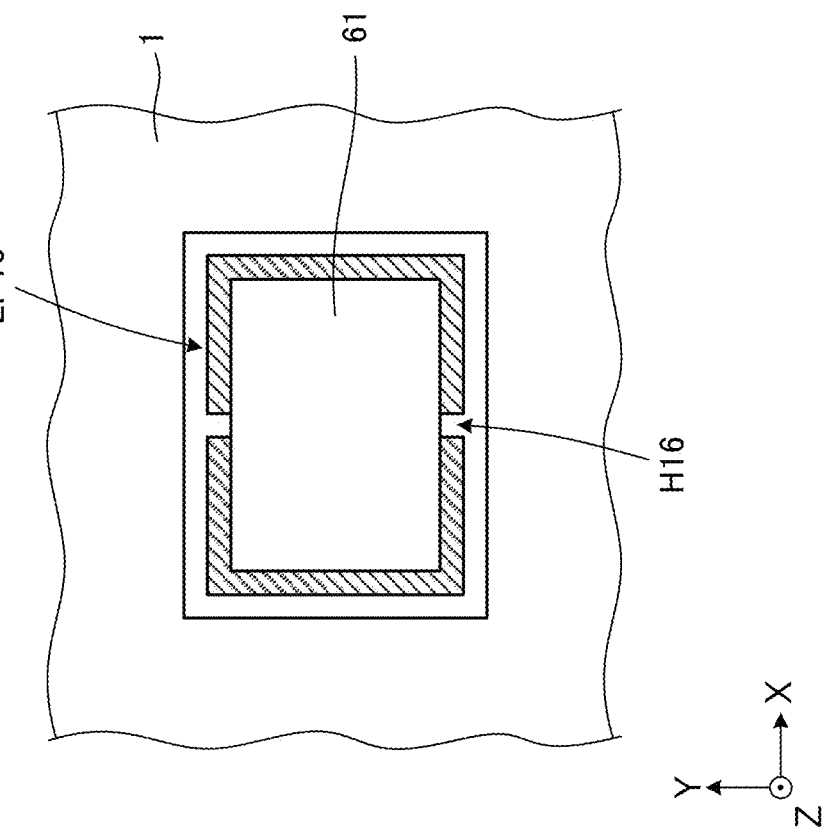
FIG. 8A is a plan view showing a mounting electrode EP16 on which a connector 61 is mounted, in an electric element 202D according to the second preferred embodiment of the present invention.

FIG. 8A is a plan view showing a mounting electrode EP16 on which a connector 61 is mounted, in an electric element 202D according to the second preferred embodiment, and FIG. 8B is a plan view showing the mounting electrode EP16 of a multilayer substrate 102D according to the second preferred embodiment. In FIG. 8A, a conductor portion of the mounting electrode EP16 is indicated by hatching. In addition, in FIG. 8B, the mounting electrode EP16 is indicated by a dot pattern, and a mounting region M16 is indicated by a dashed line.

The mounting electrode EP16 is different from the mounting electrode EP11 according to the first preferred embodiment in that the protective layer 1 is spaced apart from the mounting electrode EP16 (a clearance resist structure). In addition, the mounting electrode EP16 is different from the mounting electrode EP11 in that a first opening H16 is provided. The first opening H16 is a linear or substantially linear through hole extending in the Y-axis direction. As shown in FIG. 8B, the periphery of the first opening H16 is not surrounded by a conductor.

FIG. 9A is a plan view showing a mounting electrode EP17 on which a connector 61 is mounted, in an electric element 202E according to the second preferred embodiment, and FIG. 9B is a plan view showing the mounting electrode EP17 of a multilayer substrate 102E according to the second preferred embodiment. In FIG. 9A, a conductor portion of the mounting electrode EP17 is indicated by hatching. In addition, in FIG. 9B, the mounting electrode EP17 is indicated by a dot pattern, and a mounting region M17 is indicated by a dashed line.

The mounting electrode EP17 is different from the mounting electrode EP11 according to the first preferred embodiment in that the protective layer 1 is spaced apart from the mounting electrode EP17 (a clearance resist structure). In addition, the mounting electrode EP17 is different from the mounting electrode EP11 in that first openings H17a and H17b are provided. The first openings H17a and H17b are linear or substantially linear through holes extending in the Y-axis direction, and are parallel or substantially parallel to each other. As shown in FIG. 9B, the periphery of the first openings H17a and H17b is not surrounded by a conductor. Even with the features described above, in a plan view of the mounting surface (when viewed in the Z-axis direction), the first opening is provided over (across) a mounting region of the mounting electrode and a non-mounting region of the mounting electrode. Therefore, the same or similar functions and advantageous effects as the electric element 201 (the multilayer substrate 101) of the first preferred embodiment are provided.

Third Preferred Embodiment

A third preferred embodiment of the present invention provides an example in which a stacked body includes a bent portion.

FIG. 10A is a front view showing a main portion of an electronic device 401 according to the third preferred embodiment of the present invention, and FIG. 10B is a front view of an electric element 203 according to the third preferred embodiment.

The electronic device 401 includes an electric element 203 and circuit boards 301 and 302. Other substrates, electronic components, or the like that are mounted on the circuit boards 301 and 302 are not shown. The circuit boards 301 and 302 are printed wiring boards, for example.

As mainly shown in FIG. 10B, the electric element 203 is different from the electric element 201 according to the first preferred embodiment in that a stacked body 10 includes a bent portion CR that has been bent. In addition, the electric element 203 is different from the electric element 201 in that a connector 61 is mounted on the first surface S1, and a connector 62 is mounted on the second surface S2.

The electric element 203, while being bent, is connected between the circuit boards 301 and 302. The connector 61 of the electric element 203 is connected to a receptacle 71 mounted on the circuit board 301. The connector 62 of the electric element 203 is connected to a receptacle 72 mounted on the circuit board 302.

As mainly shown in FIG. 10B, a distance between a second region R2 (a region in which a second opening is provided) and the bent portion CR is smaller than a distance between a first region R1 (a region in which a first opening is provided) and the bent portion CR.

According to the third preferred embodiment of the present invention, the following advantageous effects in addition to the advantageous effects described in the first preferred embodiment are provided.

In the third preferred embodiment, the distance between at least one second region R2 (the second opening) and the bent portion CR is smaller than the distance between the first region R1 (the first opening) and the bent portion CR. When bending stress is applied to the conductor pattern including the opening, a tear or a crack easily occurs starting from the opening. As a result, peeling of a conductor pattern or interlayer peeling, or degradation of electrical characteristics easily occurs. Accordingly, the first opening is spaced apart from a bent portion CR, and the occurrence of a tear or a crack starting from the first opening due to bending stress is significantly reduced or prevented. Accordingly, the occurrence of peeling of a mounting electrode, the interlayer peeling adjacent to or in a vicinity of the mounting electrode, or the like is able to be significantly reduced or prevented.

The first opening and the second opening are preferably provided in portions other than the bent portion CR, for example. The first opening and the second opening are provided in portions other than the bent portion CR. Accordingly, the occurrence of a tear or a crack starting from the first opening and the second opening is able to be further significantly reduced or prevented, and, as a result, the occurrence of peeling of a conductor pattern or interlayer peeling, or degradation of electrical characteristics, is able to be further significantly reduced or prevented.

While each of the above-described preferred embodiments provides an example in which the stacked body is a rectangular or substantially rectangular flat plate, the shape of the stacked body is able to be appropriately changed within the scope of the functions and advantageous effects of the preferred embodiments of the present invention. The planar shape of the stacked body may be a polygon, a circle, an ellipse, an arc shape, an L shape, a U shape, a Y shape, a T shape, or a crank shape, for example. In addition, the first surface S1 and the second surface S2 of the stacked body may not be limited to a perfect plane and may be a partially curved surface or a similar surface. The second surface S2 is dispensable in the stacked body of preferred embodiments of the present invention.

While each of the above described preferred embodiments provides an example in which the stacked body 10 is a flat plate including a thermoplastic resin, the present invention is not limited to the features described above. The stacked body 10 may be a flat plate including a thermosetting resin, for example. In addition, the stacked body 10 may be dielectric ceramics, for example, low temperature co-fired ceramics (LTCC). In addition, the stacked body 10 may be a composite stacked body of a plurality of resins, or may be provided by stacking a thermosetting resin sheet, for example, glass epoxy substrate and a thermoplastic resin sheet. In addition, the stacked body 10 is not limited to a stacked body including a plurality of insulating base material layers of which the surfaces are fused by heating and pressing (collectively pressing) the plurality of insulating base material layers, and may include an adhesive layer between each of the plurality of insulating base material layers.

In addition, while each of the above described preferred embodiments provides an example of the stacked body provided by stacking three insulating base material layers 11, 12, and 13, and two protective layers 1 and 2, the present invention is not limited to the features described above. The number of insulating base material layers defining the stacked body is able to be appropriately changed within the scope of producing the functions and advantageous effects of the present invention. In addition, while each of the above described preferred embodiments provides an example in which the protective layers 1 and 2 are epoxy resin films, the protective layers 1 and 2 may be solder resist films or coverlay films, for example. The protective layers are dispensable in the stacked body of the present invention.

While each of the above described preferred embodiments provides an example of the electric element including two or six mounted components, the number of mounted components is not limited to this example. In addition, the mounted components is not limited to the structure and positions described in each of the above described preferred embodiments. Furthermore, while each of the above described preferred embodiments provides an example in which the "mounted component" is a connector, the "mounted component" is not limited to this example. The mounted component may be, for example, a chip component such as a chip inductor or a chip capacitor, an IC, an RFIC element, or an impedance matching circuit.

While each of the above described preferred embodiments provides an example in which all the conductor patterns other than the mounting electrode are provided inside the stacked body, the multilayer substrate is not limited to the features described above. The conductor patterns other than the mounting electrode may be provided on the front surface of the stacked body. In addition, while each of the above described preferred embodiments provides an example of the multilayer substrate including the conductor patterns, for example, the signal conductors 31 and 32, and the ground conductors 41, 42, and 43, the multilayer substrate may include a conductor pattern other than such conductor patterns.

While each of the above described preferred embodiments provides an example in which the electric element (the multilayer substrate) is a cable that connects two components, the electric element is not limited to this example. The electric element may be an electronic component of which the entirety is mounted on another substrate, for example. In addition, the circuit provided in the electric element is not limited to a stripline transmission line. The electric element may include other various transmission lines (a microstrip line and a coplanar line, for example). In addition, the number of transmission lines provided in the electric element is not limited to one, and may be two or more. Furthermore, in the electric element, for example, an inductor, a capacitor, or a frequency filter such as a low-pass filter, a high-pass filter, a band pass filter, or a band elimination filter may be defined by a conductor pattern. In addition, various components, for example, a chip component, may be embedded in the electric element.

While each of the above described preferred embodiments provides an example in which the outline of the mounting electrode is rectangular or substantially rectangular, the shape of the outline is not limited to the features described above. The shape, number, and positioning of the mounting electrodes are able to be appropriately changed within the scope of the functions and advantageous effects of the preferred embodiments of the present invention. The planar shape of the mounting electrode may be a polygon, a circle, an ellipse, an arc, a ring, an L shape, a U shape, a T shape, a Y shape, or a crank shape, for example.

In addition, the shape, number, and positioning of the first openings are not limited to the structure described in each of the above described preferred embodiments, and are able to be appropriately changed within the scope of the functions and advantageous effects of the preferred embodiments of the present invention. The shape of the first opening may be a polygon, a circle, an ellipse, an arc, a U shape, a T shape, a Y shape, or a crank shape, for example.

While each of the above described preferred embodiments provides an example of the multilayer substrate in which the plurality of circular second openings are provided in the ground conductor, the shape, the number, and the like of second openings are able to be appropriately changed within the scope of the functions and advantageous effects of the preferred embodiments of the present invention. The shape of the second opening may be a rectangle, a polygon, an ellipse, an L shape, an arc, a U shape, a T shape, a Y shape, or a crank shape, for example. In addition, while each of the above described preferred embodiments provides an example in which the plurality of second openings, in a plan view of the mounting surface (when viewed in the Z-axis direction), are staggered at equal or substantially equal intervals from each other, the shape, number, and positioning of the plurality of second openings are able to be appropriately changed within the scope of the functions and advantageous effects of the preferred embodiments of the present invention.

While each of the above described preferred embodiments provides an example in which the interlayer connection conductors V11, V20, V21, V22, and V23 are via conductors including conductive paste, the present invention is not limited to the features described above. The interlayer connection conductor may be a plated through hole or a plated filled via that penetrates a stacked body and connects a plurality of conductor patterns, for example. In a case in which the interlayer connection conductor is a plated through hole or a plated filled via, compared with an interlayer connection conductor including a resin material, the amount of produced gas is able to be significantly reduced.

Finally, the above described preferred embodiments are to be considered in all respects as illustrative and not restrictive. While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a stacked body including a plurality of insulating base material layers stacked on each other and a mounting surface; and
    a conductor pattern provided in contact with at least one of the plurality of insulating base material layers and including a mounting electrode provided on the mounting surface; wherein
    the mounting electrode includes a first opening;
    the first opening, in a plan view of the mounting surface, is provided over a mounting region and a non-mounting region of the mounting electrode; and
    when a mounted component is mounted the mounting region overlaps with the mounted component, and the non-mounting region does not overlap with the mounted component;
    the conductor pattern includes a plurality of conductor patterns;
    the plurality of conductor patterns includes a signal conductor and a ground conductor;
    the ground conductor is provided on an entire or substantially an entire surface of one of the plurality of insulating base material layers; and
    the ground conductor includes an opening portion at a position corresponding to the signal conductor.

2. The multilayer substrate according to claim 1, wherein the plurality of insulating base material layers include a resin as a main material.

3. The multilayer substrate according to claim 2, wherein the first opening is linear or substantially linear; and
    in a direction perpendicular or substantially perpendicular to an extending direction of the first opening, a conductor width of the mounting electrode is about 1 mm or less, and an opening width of the first opening is about 0.1 mm or less and is about 1/50 or more of the conductor width of the mounting electrode.

4. The multilayer substrate according to claim 2, wherein the first opening is provided in a largest conductor pattern among the plurality of conductor patterns.

5. The multilayer substrate according to claim 2, wherein the conductor pattern, in the plan view of the mounting surface, includes a second opening of which a periphery is surrounded by a conductor.

6. The multilayer substrate according to claim 5, wherein the conductor pattern includes a surface layer pattern located on an outermost layer in a stacking direction of the plurality of insulating base material layers, and an inner layer pattern located on an inner layer further inside than the surface layer pattern; and
the surface layer pattern includes the second opening.

7. The multilayer substrate according to claim 5, wherein the second opening is provided in a largest conductor pattern among the plurality of conductor patterns.

8. The multilayer substrate according to claim 5, wherein the stacked body includes a bent portion to be bent; and
the first opening and the second opening are provided in portions other than the bent portion.

9. The multilayer substrate according to claim 2, further comprising:
an interlayer connection conductor provided, among the plurality of insulating base material layers, in an insulating base material layer on which the mounting electrode is provided; wherein
the interlayer connection conductor includes a resin material; and
the interlayer connection conductor, in the plan view of the mounting surface, overlaps with the mounting electrode.

10. An electric element comprising:
the multilayer substrate according to claim 1; and
the mounted component mounted on the mounting surface and connected to the mounting electrode.

11. The electric element according to claim 10, wherein the mounted component includes a connector that is electrically connected to the mounting electrode by a conductive bonding material.

12. The multilayer substrate according to claim 1, wherein the mounting electrode is a conductor pattern that has a rectangular or substantially rectangular shape.

13. The multilayer substrate according to claim 1, wherein
the stacked body includes at least one protective layer provided on the plurality of insulating base material layers; and
the stacked body is flexible.

14. A multilayer substrate comprising:
a stacked body including a plurality of insulating base material layers stacked on each other and a mounting surface; and
a conductor pattern provided in contact with at least one of the plurality of insulating base material layers and including a mounting electrode provided on the mounting surface; wherein
the mounting electrode includes a first opening;
the first opening, in a plan view of the mounting surface, is provided over a mounting region and a non-mounting region of the mounting electrode;
when a mounted component is mounted the mounting region overlaps with the mounted component, and the non-mounting region does not overlap with the mounted component;
the plurality of insulating base material layers include a resin as a main material;
the conductor pattern, in the plan view of the mounting surface, includes a second opening of which a periphery is surrounded by a conductor;
the conductor pattern includes a surface layer pattern located on an outermost layer in a stacking direction of the plurality of insulating base material layers, and an inner layer pattern located on an inner layer further inside than the surface layer pattern; and
the surface layer pattern and the inner layer pattern includes the second opening.

15. A multilayer substrate comprising:
a stacked body including a plurality of insulating base material layers stacked on each other and a mounting surface; and
a conductor pattern provided in contact with at least one of the plurality of insulating base material layers and including a mounting electrode provided on the mounting surface; wherein
the mounting electrode includes a first opening;
the first opening, in a plan view of the mounting surface, is provided over a mounting region and a non-mounting region of the mounting electrode;
when a mounted component is mounted the mounting region overlaps with the mounted component, and the non-mounting region does not overlap with the mounted component;
the plurality of insulating base material layers include a resin as a main material;
the conductor pattern, in the plan view of the mounting surface, includes a second opening of which a periphery is surrounded by a conductor;
the second opening includes a plurality of second openings; and
the plurality of second openings, in the plan view of the mounting surface, are provided at equal or substantially equal intervals from each other.

16. The multilayer substrate according to claim 15, wherein
the stacked body includes a bent portion to be bent; and
a distance between at least one of the plurality of second openings and the bent portion is smaller than a distance between the first opening and the bent portion.

* * * * *